United States Patent
Takami et al.

(10) Patent No.: US 12,309,988 B2
(45) Date of Patent: May 20, 2025

(54) ELECTROMAGNETIC WAVE SHIELD FILM

(71) Applicant: TATSUTA ELECTRIC WIRE & CABLE CO., LTD., Osaka (JP)

(72) Inventors: Kouji Takami, Kyoto (JP); Kenji Kamino, Kyoto (JP); Masahiro Watanabe, Kyoto (JP)

(73) Assignee: TATSUTA ELECTRIC WIRE &CABLE CO., LTD., Osaka (JP)

( * ) Notice: Subject to any disclaimer, the term of this patent is extended or adjusted under 35 U.S.C. 154(b) by 0 days.

(21) Appl. No.: 18/550,965

(22) PCT Filed: Mar. 30, 2022

(86) PCT No.: PCT/JP2022/015769
§ 371 (c)(1),
(2) Date: Sep. 17, 2023

(87) PCT Pub. No.: WO2022/210820
PCT Pub. Date: Oct. 6, 2022

(65) Prior Publication Data
US 2024/0188267 A1      Jun. 6, 2024

(30) Foreign Application Priority Data
Mar. 31, 2021   (JP) ................. 2021-060396

(51) Int. Cl.
*H05K 9/00*      (2006.01)
*H05K 1/02*      (2006.01)

(52) U.S. Cl.
CPC ......... *H05K 9/0084* (2013.01); *H05K 1/0216* (2013.01); *H05K 9/0083* (2013.01)

(58) Field of Classification Search
CPC ...................................... H05K 9/0084
See application file for complete search history.

(56) References Cited

U.S. PATENT DOCUMENTS

2015/0009637 A1*   1/2015   Kawaguchi .......... H05K 1/0216
                                                              156/247
2022/0061150 A1*   2/2022   Aoyagi ..................... H05K 1/09

FOREIGN PATENT DOCUMENTS

| JP | 2017010995 A | 1/2017 |
| WO | 2018147426 A1 | 8/2018 |
| WO | 2020090727 A1 | 5/2020 |

OTHER PUBLICATIONS

International Search Report dated Jun. 20, 2022, in connection with underlying PCT application PCT/JP2022/015769.
(Continued)

*Primary Examiner* — Hung V Ngo
(74) *Attorney, Agent, or Firm* — United IP Counselors, LLC; Kenneth M Fagin (57) ABSTRACT

An electromagnetic wave shielding film includes: a protective layer; a shield layer laminated on the protective layer; and an adhesive layer laminated on the shield layer. Conductive bumps are formed on a side of the adhesive layer of the shield layer. The conductive bumps are positioned on a tessellation of one kind of polygon at vertices of respective polygons, and the conductive bumps are arranged such that, with respect to each of the conductive bumps, when drawing line segments connecting respective conductive bumps and nearest conductive bumps at a nearest position and drawing a straight line passing through one line segment among the drawn line segments, the straight line has a portion that does not overlap with the other line segments.

3 Claims, 7 Drawing Sheets

(56) References Cited

OTHER PUBLICATIONS

Written Opinion dated Jun. 20, 2022, in connection with underlying PCT application PCT/JP2022/015769.

\* cited by examiner

ELECTROMAGNETIC WAVE SHIELD FILM

TECHNICAL FIELD

The present invention relates to an electromagnetic wave shielding film.

BACKGROUND ART

Printed wiring boards typified by flexible printed wiring boards are widely used in order to incorporate a circuit into a complicated mechanism in electronic equipment such as mobile phones, video cameras, and notebook personal computers of which sizes are rapidly becoming smaller and functions are rapidly becoming advanced. Furthermore, taking advantage of their superior flexibility, printed wiring boards are also being used to connect a movable unit such as a printer head to a control unit. Measures for shielding electromagnetic waves are essential in such electronic equipment, and even as printed wiring boards to be used inside a device, printed wiring boards with electromagnetic shielding measures (hereinafter, also referred to as "shielded printed wiring boards") such as being adhered with an electromagnetic wave shielding film are becoming more frequently used.

Generally, an electromagnetic wave shielding film is made up of an outermost protective layer, a shield layer for shielding electromagnetic waves, and an adhesive layer for adhering the film to a printed wiring board.

When manufacturing a shielded printed wiring board, the electromagnetic wave shielding film is to be adhered to the printed wiring board so that the adhesive layer of the electromagnetic wave shielding film comes into contact with the printed wiring board.

In addition, a ground circuit of the printed wiring board should be electrically connected to an external ground such as an enclosure, for example the electric connection between the ground circuit of the printed wiring board and the external ground is also performed via the electromagnetic wave shielding film adhered to the printed wiring board.

Generally, since it is not common practice to design an electromagnetic wave shielding film so as to conform to each individual printed wiring board, an electromagnetic wave shielding film needs to be capable of shielding any kind of a printed wiring board from electromagnetic waves.

This is due to the fact that there are a countless number of configurations such as a shape, wiring, and the like of printed wiring boards and designing an optimal electromagnetic wave shielding film so as to conform to each individual printed wiring board is not realistic in terms of cost-effectiveness.

For example, Patent Literature 1 discloses, as an electromagnetic wave shielding film capable of meeting such requirements, an electromagnetic wave shielding film made up of a protective layer, a shield layer laminated on the protective layer, and an adhesive layer laminated on the shield layer, wherein conductive bumps are formed on a side of the adhesive layer of the shield layer, a volume of each of the conductive bumps ranges from 30,000 to 400,000 $\mu m^3$.

In Patent Literature 1, in order to sufficiently reduce connection resistance between the ground circuit and the shield layer of the printed wiring board, conductive bumps are formed on the shield layer of the electromagnetic wave shielding film and the conductive bumps are brought into contact with the ground circuit of the printed wiring board.

CITATION LIST

Patent Literature

Patent Literature 1: International Publication No. WO 2020/090727

SUMMARY OF INVENTION

Technical Problem

When fabricating a shielded printed wiring board using the electromagnetic wave shielding film described in Patent Literature 1, transmission loss may increase in the shielded printed wiring board.

The present invention has been made in consideration of the problem described above and an object thereof is to provide an electromagnetic wave shielding film capable of reducing transmission loss.

Solution to Problem

The present inventors arrived at the present invention by discovering that, in the electromagnetic wave shielding film according to Patent Literature 1, there are cases where transmission loss increases when conductive bumps are linearly arrayed at regular intervals in a plan view of the electromagnetic wave shielding film.

Specifically, an electromagnetic wave shielding film according to the present invention includes: a protective layer; a shield layer laminated on the protective layer; and an adhesive layer laminated on the shield layer, a plurality of conductive bumps being formed on a side of the adhesive layer of the shield layer, in a plan view of the shield layer from the side of the adhesive layer, the conductive bumps being arranged so as to be positioned on a tessellation of one kind of polygon at vertices of respective polygons, and the plurality of conductive bumps being arranged such that, with respect to each of the plurality of conductive bumps, when drawing line segments connecting the respective conductive bumps and nearest conductive bumps at a nearest position and drawing a straight line passing through one line segment among the drawn line segments, the straight line having a portion that does not overlap with the other line segments.

The conductive bumps being arrayed in this manner means that, in a plan view of the shield layer from the side of the adhesive layer, adjacent conductive bumps are not linearly arrayed at regular intervals.

The electromagnetic wave shielding film according to the present invention is to be arranged on a printed wiring board.

First, a reason why transmission loss increases when an electromagnetic wave shielding film on which conductive bumps are linearly arrayed at regular intervals is used in a printed wiring board will be described.

Generally, in a printed wiring board, a signal circuit that is separate from a ground circuit is arranged near the ground circuit. When arranging an electromagnetic wave shielding film on the printed wiring board, a conductive bump of the electromagnetic wave shielding film may end up being positioned on such a signal circuit and, accordingly, a parasitic circuit may be generated and transmission loss may increase.

In particular, if conductive bumps are linearly arranged at regular intervals, the number of conductive bumps positioned on a signal circuit increases when an array direction of the conductive bumps and a formation direction of the signal circuit coincide with each other. In this case, a large number of parasitic circuits are generated and transmission loss increases.

In addition, when there are a plurality of signal circuits, the number of parasitic circuits generated between the signal circuits and the conductive bumps may become uneven for each signal circuit. In such a case, transmission loss further increases.

However, in the electromagnetic wave shielding film according to the present invention, since conductive bumps are not linearly arrayed at regular intervals, parasitic circuits can be prevented from being created due to the conductive bumps being positioned on a signal circuit of a printed wiring board and, consequently, transmission loss can be reduced.

In order to prevent a large number of conductive bumps from being arranged on a signal circuit, a method of randomly arranging the conductive bumps is also conceivable. However, randomly arranging the conductive bumps increases the likelihood of creating portions where contact between a conductive bump and a ground circuit is insufficient.

In the electromagnetic wave shielding film according to the present invention, the conductive bumps are arranged so as to be positioned on a tessellation of one kind of polygon at vertices of respective polygons. In other words, in the electromagnetic wave shielding film according to the present invention, the conductive bumps are regularly arranged in a staggered manner.

When the conductive bumps are regularly arrayed in a staggered manner, the conductive bumps and the ground circuit can be reliably brought into contact with each other.

As a result, connection stability between the shield layer of the electromagnetic wave shielding film and the ground circuit of the printed wiring board can be increased.

In the electromagnetic wave shielding film according to the present invention, the polygon may be a convex polygon or a non-convex polygon.

A convex polygon refers to a polygon in which angles of all corners are less than 180 degrees.

In addition, a non-convex polygon refers to a polygon having at least one corner with an angle greater than 180 degrees.

Advantageous Effects of Invention

The electromagnetic wave shielding film according to the present invention is to be arranged on a printed wiring board on which a ground circuit is formed. In doing so, conductive bumps of the electromagnetic wave shielding film according to the present invention and the ground circuit of the printed wiring board come into contact with each other.

In the electromagnetic wave shielding film according to the present invention, since adjacent conductive bumps are not linearly arrayed at regular intervals, parasitic circuits can be prevented from being created due to the conductive bumps being positioned on a signal circuit of a printed wiring board and, consequently, transmission loss can be reduced.

DESCRIPTION OF EMBODIMENTS

Hereinafter, an electromagnetic wave shielding film according to the present invention will be described in specific terms. However, it should be noted that the present invention is not limited to the embodiments described below and that the present invention can be appropriately modified and applied without deviating from the gist of the invention.

An electromagnetic wave shielding film according to the present invention includes: a protective layer; a shield layer laminated on the protective layer; and an adhesive layer laminated on the shield layer, a plurality of conductive bumps being formed on a side of the adhesive layer of the shield layer, in a plan view of the shield layer from the side of the adhesive layer, the conductive bumps being arranged so as to be positioned on a tessellation of one kind of polygon at vertices of respective polygons, and the plurality of conductive bumps being arranged such that, with respect to each of the plurality of conductive bumps, when drawing line segments connecting the respective conductive bumps and nearest conductive bumps at a nearest position and drawing a straight line passing through one line segment among the drawn line segments, the straight line having a portion that does not overlap with the other line segments.

As long as the electromagnetic wave shielding film according to the first embodiment of the present invention has the features described above, the electromagnetic wave shielding film can include any other feature insofar as advantageous effects of the invention are produced.

Hereinafter, an example of the electromagnetic wave shielding film according to the first embodiment of the present invention will be described with reference to the drawings.

Figure 1A:
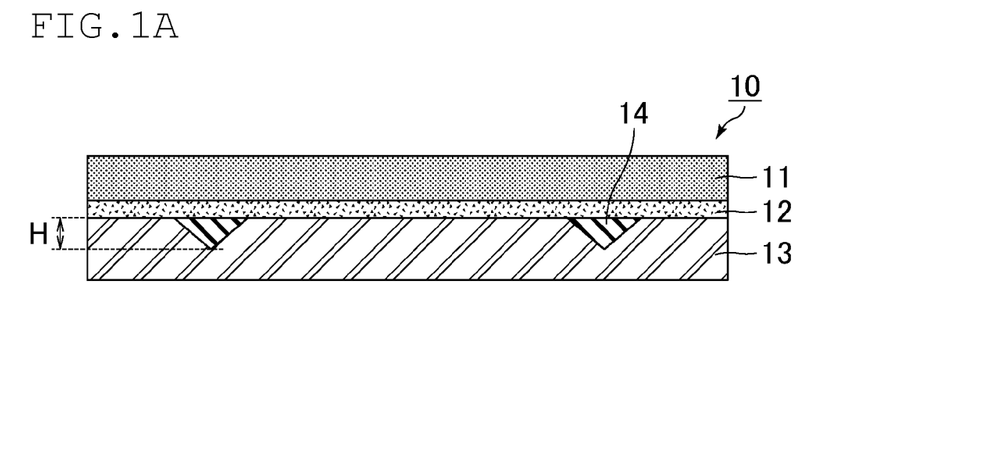
FIG. 1A is a sectional view schematically showing an example of an electromagnetic wave shielding film according to a first embodiment of the present invention.

FIG. 1A is a sectional view schematically showing an example of the electromagnetic wave shielding film according to the first embodiment of the present invention.

As shown in FIG. 1A, an electromagnetic wave shielding film 10 is made up of a protective layer 11, a shield layer 12 laminated on the protective layer 11, and an adhesive layer 13 laminated on the shield layer 12.

The protective layer 11, the shield layer 12, and the adhesive layer 13 are laminated in sequence.

In addition, a plurality of conductive bumps 14 are formed on a side of the adhesive layer 13 of the shield layer 12.

An array of the conductive bumps 14 of the electromagnetic wave shielding film 10 will be described.

Figure 1B:
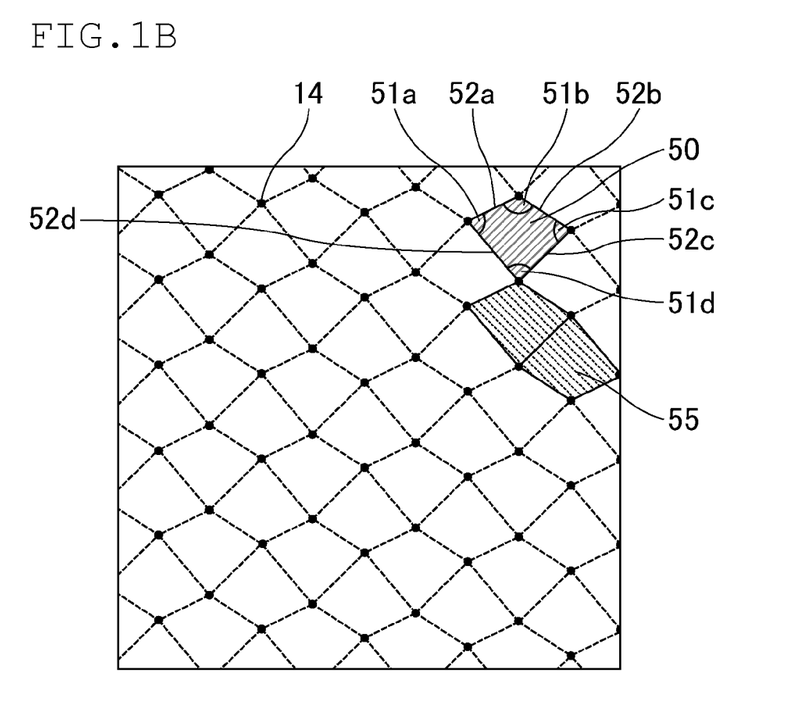
FIG. 1B is a plan view schematically showing an array of conductive bumps in a plan view of a shield layer of the electromagnetic wave shielding film shown in FIG. 1A from a side of an adhesive layer.

FIG. 1B is a plan view schematically showing an array of conductive bumps in a plan view of the shield layer of the electromagnetic wave shielding film shown in FIG. 1A from a side of the adhesive layer.

As shown in FIG. 1B, in the electromagnetic wave shielding film 10, the conductive bumps 14 are arranged on a tessellation of quadrilaterals 50 so as to be positioned at vertices of the respective quadrilaterals 50.

While a quadrilateral denoted by a reference sign 50 is highlighted and illustrated in FIG. 1B for convenience of description, the highlighted and illustrated quadrilateral 50 is no different from other quadrilaterals in terms of structure, functions, and the like.

The quadrilateral 50 is a convex quadrilateral having a first corner 51a, a second corner 51b, a third corner 51c, and a fourth corner 51d.

The first corner 51a and the second corner 51b are connected by a first side 52a, the second corner 51b and the third corner 51c are connected by a second side 52b, the third corner 51c and the fourth corner 51d are connected by a third side 52c, and the fourth corner 51d and the first corner 51a are connected by a fourth side 52d.

Angles of the first corner 51a, the second corner 51b, the third corner 51c, and the fourth corner 51d differ from one another.

In addition, lengths of the first side 52a, the second side 52b, the third side 52c, and the fourth side 52d differ from one another.

Next, a mode of tessellation by the quadrilaterals 50 will be described.

Two quadrilaterals 50 are combined to form a hexagonal parallelogon (a graphic denoted by a reference sign 55 in FIG. 1B).

Since any congruent hexagonal parallelogon can tessellate a plane, by successively arranging the hexagonal parallelogons 55 combined in this manner, tessellation by the quadrilateral 50 as shown in FIG. 1B can be achieved.

Next, an array of the conductive bumps 14 will be described.

In the electromagnetic wave shielding film 10, with respect to each of the conductive bumps 14, when drawing a line segment connecting the conductive bump 14 and a nearest conductive bump 14 at a nearest position (hereinafter, also described as "a line segment connecting nearest conductive bumps") and drawing a straight line passing through one line segment among the drawn line segments, the conductive bumps 14 are arranged so that the straight line has a portion that does not overlap with other line segments.

The fact that the conductive bumps 14 are arrayed in this manner will be described in specific terms with reference to the drawings.

Figure 1C:
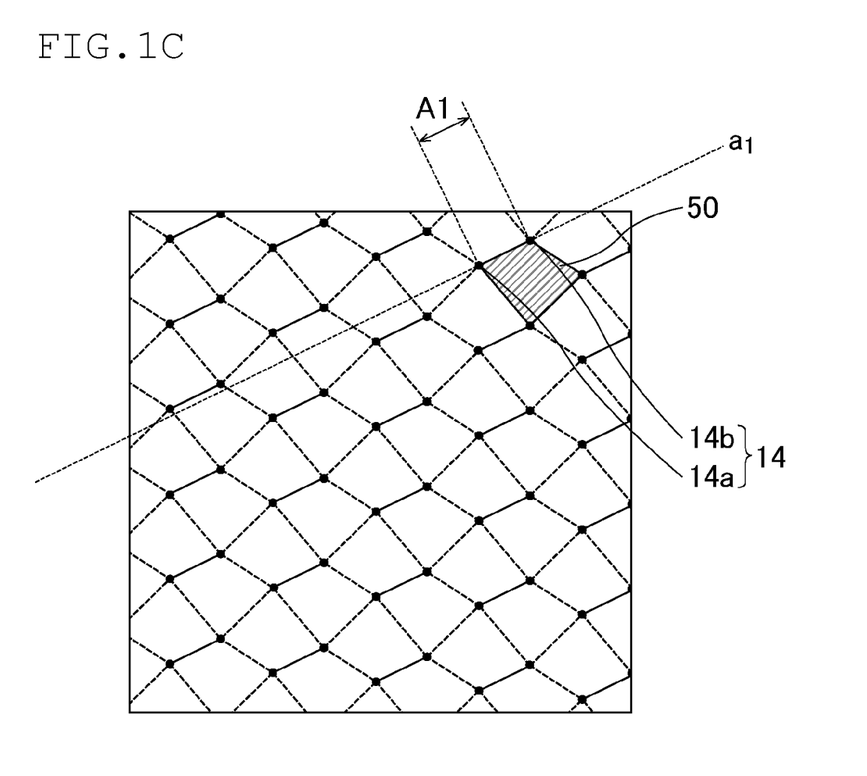
FIG. 1C is a plan view describing that the array of the conductive bumps is characteristic of the present invention in the electromagnetic wave shielding film shown in FIG. 1A and FIG. 1B.

FIG. 1C is a plan view describing that the array of the conductive bumps is characteristic of the present invention in the electromagnetic wave shielding film shown in FIG. 1A and FIG. 1B.

As shown in FIG. 1C, first, a line segment connecting each conductive bump 14 and a nearest conductive bump 14 at a nearest position (a line segment indicated by a solid line connecting conductive bumps 14 in FIG. 1C) is drawn.

In FIG. 1C, let us focus on a conductive bump 14a and a conductive bump 14b among the conductive bumps 14. The conductive bump 14a is a nearest conductive bump at a nearest position to the conductive bump 14b. The conductive bump 14a and the conductive bump 14b are connected by a line segment A1.

When a straight line $a_1$ that passes through the line segment A1 is drawn, a line segment connecting nearest conductive bumps other than the line segment A1 does not exist on the straight line $a_1$. In other words, the straight line $a_1$ has a portion that does not overlap with a line segment that connects each conductive bump and a nearest conductive bump at a nearest position to each other.

The conductive bumps 14 being arrayed in this manner means that, in a plan view of the shield layer 12 from the side of the adhesive layer 13, adjacent conductive bumps 14 are not linearly arrayed at regular intervals but are regularly arranged in a staggered manner.

The electromagnetic wave shielding film 10 is arranged on the printed wiring board and exhibits advantageous effects when becoming a part of constituent elements of a shielded printed wiring board.

In consideration thereof, a shielded printed wiring board including the electromagnetic wave shielding film 10 will be described.

Figure 2:
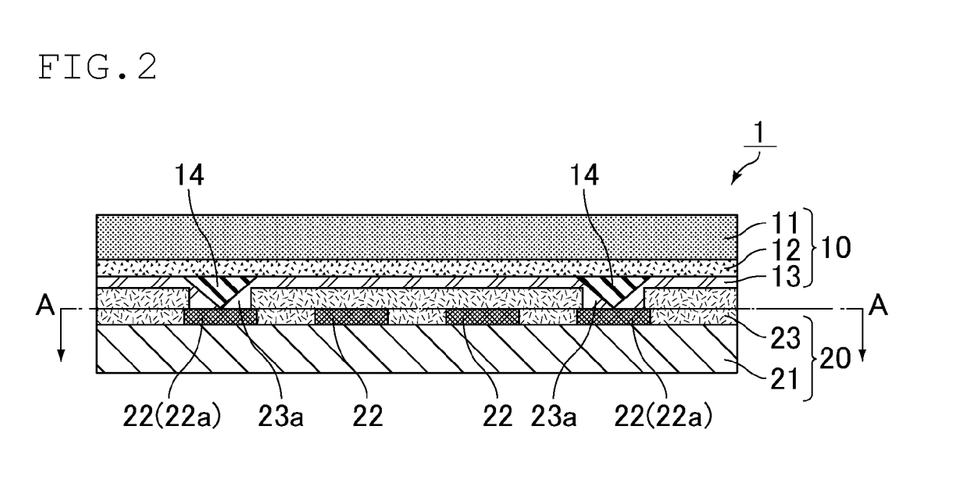
FIG. 2 is a sectional view schematically showing an example of a shielded printed wiring board in which the electromagnetic wave shielding film according to the first embodiment of the present invention is used.

FIG. 2 is a sectional view schematically showing an example of a shielded printed wiring board in which the electromagnetic wave shielding film according to the first embodiment of the present invention is used.

As shown in FIG. 2, a shielded printed wiring board 1 includes a base film 21, a printed circuit 22 including a plurality of ground circuits 22a formed on the base film 21, and a coverlay 23 that covers the printed circuit 22. The coverlay 23 includes, as constituent elements, a printed wiring board 20 on which an opening portion 23a that exposes the ground circuits 22a is formed and the electromagnetic wave shielding film 10 arranged on the printed wiring board 20.

In the shielded printed wiring board 1, the conductive bumps 14 of the electromagnetic wave shielding film 10 penetrate the adhesive layer 13 and are in contact with the ground circuits 22a of the printed wiring board 20.

A reason why transmission loss increases when an electromagnetic wave shielding film on which conductive bumps are linearly arrayed at regular intervals is used in a printed wiring board will now be described.

Generally, in a printed wiring board, a signal circuit that is separate from a ground circuit is arranged near the ground circuit. When arranging an electromagnetic wave shielding film on the printed wiring board, a conductive bump of the electromagnetic wave shielding film may end up being positioned on such a signal circuit and, accordingly, a parasitic circuit may be generated and transmission loss may increase.

In particular, if conductive bumps are linearly arranged at regular intervals, the number of conductive bumps positioned on a signal circuit increases when an array direction of the conductive bumps and a formation direction of the signal circuit coincide with each other. In this case, a large number of parasitic circuits are generated and transmission loss increases.

In addition, when there are a plurality of signal circuits, the number of parasitic circuits generated between the signal circuits and the conductive bumps may become uneven for each signal circuit. In such a case, transmission loss further increases.

However, in the electromagnetic wave shielding film 10, since the conductive bumps 14 are not linearly arrayed at regular intervals, parasitic circuits can be prevented from being created due to the conductive bumps 14 being positioned on a signal circuit of the printed wiring board 20 and, consequently, transmission loss can be reduced.

Next, a positional relationship between the conductive bumps 14 and the ground circuits 22a will be described.

Figure 3:
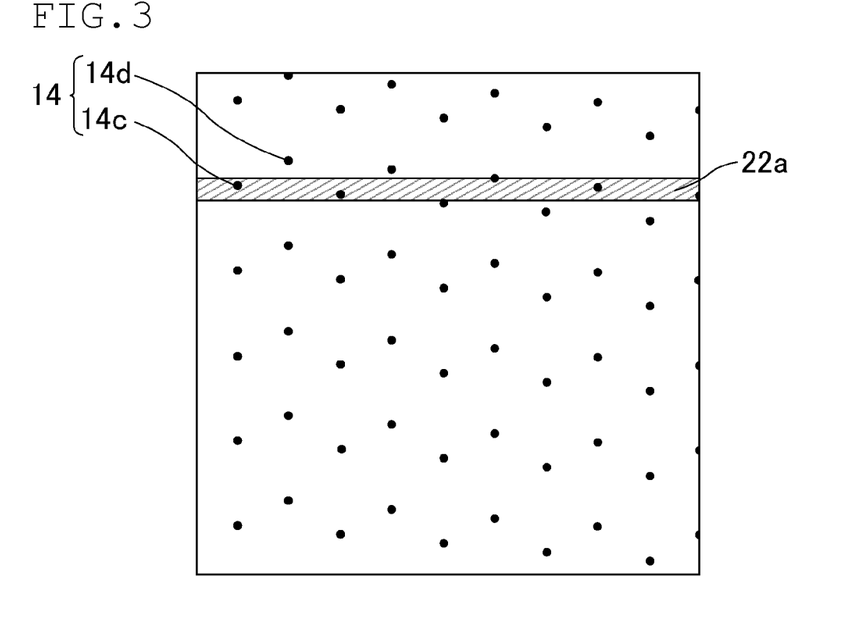
FIG. 3 is a sectional view taken along line A-A in FIG. 2.

FIG. 3 is a sectional view taken along line A-A in FIG. 2. Note that FIG. 3 only shows one ground circuit 22a for convenience of description.

As shown in FIG. 3, the ground circuit 22a is formed in a linear shape.

In addition, as shown in FIG. 3, when the conductive bumps 14 of the electromagnetic wave shielding film 10 are regularly arranged in a staggered manner, the conductive bumps 14 and the ground circuit 22a can be reliably brought into contact with each other. In other words, even when a conductive bump 14d is arranged at a position where the conductive bump 14d cannot come into contact with the ground circuit 22a, a conductive bump 14c can come into contact with the ground circuit 22a.

Therefore, connection stability between the shield layer 12 of the electromagnetic wave shielding film 10 and the ground circuits 22a of the printed wiring board 20 can be increased in the shielded printed wiring board 1.

A problem arising from a positional relationship between conductive bumps and ground circuits when the conductive bumps are linearly arrayed at regular intervals in an electromagnetic wave shielding film will also be described.

Figure 4:
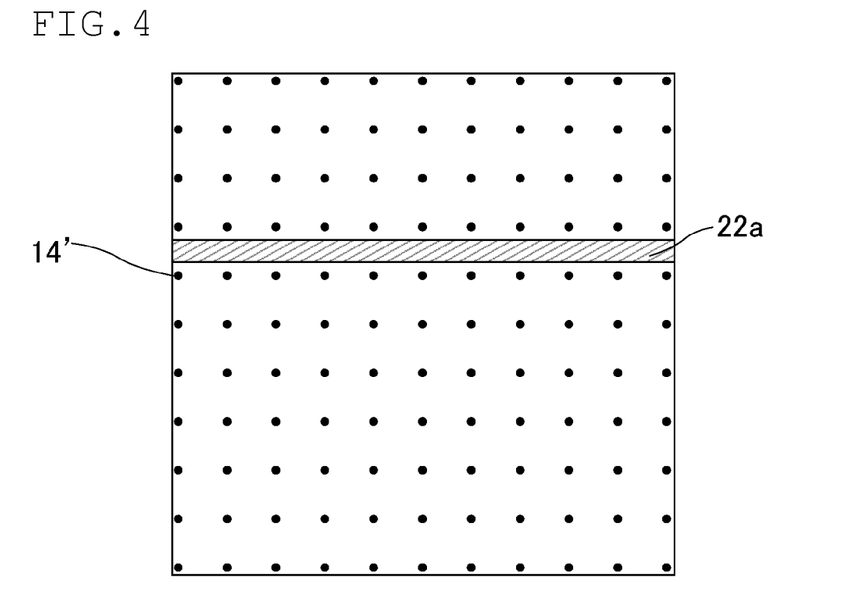
FIG. 4 is a plan view schematically showing an example of a positional relationship between conductive bumps and a ground circuit in a shielded printed wiring board including an electromagnetic wave shielding film in which conductive bumps are linearly arrayed at regular intervals.

FIG. 4 is a plan view schematically showing an example of a positional relationship between conductive bumps and a ground circuit in a shielded printed wiring board including an electromagnetic wave shielding film in which conductive bumps are linearly arrayed at regular intervals.

As shown in FIG. 4, when conductive bumps 14' are only linearly arranged, when a direction in which the ground circuit 22a is formed and an array direction of the conductive bumps 14' coincide with each other and the conductive bumps 14' are positioned so as not to come into contact with the ground circuit 22a, a state is created in which all of the linearly-arranged conductive bumps 14' cannot come into contact with the ground circuit 22a. Such a situation is particularly likely to occur when a width of the ground circuit 22a is narrow. As a result, a state is created where the shield layer of the electromagnetic wave shielding film and the ground circuit 22a of the printed wiring board cannot be electrically connected to each other via the linearly arranged conductive bumps 14'.

However, as described above, such a problem is less likely to occur in the shielded printed wiring board 1 using the electromagnetic wave shielding film 10.

Next, a preferable aspect of each component of the electromagnetic wave shielding film 10 will be described.

(Protective Layer)

While a material of the protective layer 11 is not limited, the protective layer 11 is preferably constituted of a thermoplastic resin composition, a thermoset resin composition, an active energy ray-curable composition, or the like.

Examples of the thermoplastic resin composition include, but are not limited to, a styrene resin composition, a vinyl acetate resin composition, a polyester resin composition, a polyethylene resin composition, a polypropylene resin composition, an imide resin composition, and an acrylic resin composition.

Examples of the thermoset resin composition include, but are not limited to, at least one resin composition selected from the group consisting of an epoxy resin composition, a urethane resin composition, a urethane urea resin composition, a styrene resin composition, a phenolic resin composition, a melamine resin composition, an acrylic resin composition, and an alkyd resin composition.

Examples of the active energy ray-curable composition include, but are not limited to, a polymerizable compound having at least two (meth)acryloyloxy groups in one molecule.

The protective layer 11 may be constituted of a single independent material or two or more materials.

The protective layer 11 may include, as necessary, a hardening accelerator, a tackifier, an antioxidant, a pigment, a dye, a plasticizer, an ultraviolet absorber, an antifoam agent, a leveling agent, a filler, a flame retardant, a viscosity modifier, or an antiblocking agent.

While a thickness of the protective layer 11 is not limited and can be appropriately set as necessary, the thickness preferably ranges from 1 to 15 μm and more preferably ranges from 3 to 10 μm.

When the thickness of the protective layer is less than 1 μm, it is difficult for the excessively thin protective layer to sufficiently protect the shield layer and the adhesive layer.

When the thickness of the protective layer exceeds 15 μm, the excessively thick protective layer can no longer readily bend and the protective layer itself becomes susceptible to damage. This makes the protective layer less applicable to a member that requires bending resistance.

(Shield Layer)

A material of the shield layer 12 is not limited as long as the shield layer 12 is capable of shielding electromagnetic waves and, for example, the shield layer 12 may be made of a metal or made of a conductive resin.

When the shield layer 12 is made of a metal, examples of the metal include gold, silver, copper, aluminum, nickel, tin, palladium, chromium, titanium, and zinc. Among these metals, copper is preferably used. Copper is a preferred material as the shield layer from the perspectives of conductivity and economic efficiency.

Note that the shield layer 12 may be made of an alloy of the metals described above.

In addition, the shield layer 12 may be a metal foil or a metal film formed by a method such as sputtering, electroless plating, or electrolytic plating.

When the shield layer 12 is made of a conductive resin, the shield layer 12 may be constituted of conducting particles and a resin.

The conducting particles may be, although not limited to, metal microparticles, a carbon nanotube, carbon fibers, metallic fibers, or the like.

When the conducting particles are metal microparticles, the metal microparticles may be, although not limited to, silver powder, copper powder, nickel powder, solder powder, aluminum powder, silver-coated copper powder created by subjecting copper powder to silver plating, or fine particles created by coating polymeric microparticles, glass beads, and the like with a metal.

Among these materials, inexpensively available copper powder or silver-coated copper powder is preferable from the perspective of economic efficiency.

While an average particle diameter $D_{50}$ of the conducting particles is not limited, the average particle diameter $D_{50}$ preferably ranges from 0.5 to 15.0 µm. An average particle diameter of the conducting particles of 0.5 µm or more results in favorable conductivity of the conducting resin. An average particle diameter of the conducting particles of 15.0 µm or less enables a conductive resin to be made thin.

While a shape of the conducting particles is not limited, the shape can be appropriately selected from a spherical shape, a flat shape, a scale-like shape, a dendrite shape, a rod shape, a fibrous shape, and the like.

While a blending amount of the conducting particles is not limited, the blending amount preferably ranges from 15 to 80 percent by mass and more preferably ranges from 15 to 60 percent by mass.

While the resin is not limited, examples of the resin include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition and thermoset resin compositions such as phenolic resin composition, epoxy resin composition, urethane resin composition, melamine resin composition, and an alkyd resin composition.

(Conductive Bump)

The conductive bumps 14 are to penetrate the adhesive layer 13 and come into contact with the ground circuits 22a.

While a shape of the conductive bumps 14 is not limited, the shape may be a columnar shape such as a circular cylinder, a triangular prism, or a square prism or a conical shape such as a circular cone, a triangular pyramid, or a square pyramid.

Among these shapes, a conical shape is preferable.

When the shape of the conductive bumps 14 is a conical shape, the conductive bumps 14 more readily penetrate the adhesive layer 13 and more readily come into contact with the ground circuit 22a.

A volume per one conductive bump 14 preferably ranges from 30,000 to 400,000 µm$^3$ and more preferably ranges from 50,000 to 400,000 µm$^3$.

When the volume per one conductive bump 14 is in the ranges described above, the conductive bumps 14 can come into contact with the ground circuits 22a in a reliable manner.

When the volume per one conductive bump is less than 30,000 µm$^3$, the conductive bumps are less likely to come into contact with the ground circuit and connection resistance between the ground circuits and the shield layer is likely to increase.

When the volume per one conductive bump exceeds 400,000 µm$^3$, a ratio of the conductive bumps in the adhesive layer increases.

As a result, a relative permittivity and a dielectric dissipation factor of an entire region where the adhesive layer is present are likely to increase. Therefore transmission characteristics are likely to deteriorate.

A height of the plurality of conductive bumps 14 (a height denoted by reference sign "H" in FIG. 1A) is preferably approximately the same.

When the height of the plurality of conductive bumps 14 is approximately the same, the plurality of conductive bumps 14 uniformly penetrate the adhesive layer 13 and more readily come into contact with the ground circuits 22a.

The height of the conductive bumps 14 preferably ranges from 1 to 50 µm and more preferably ranges from 5 to 30 µm.

Note that the shape, the height, and the volume of the conductive bumps can be analyzed by measuring any five points on a surface of a shield layer on which conductive bumps have been formed using a confocal microscope (OPTELICS HYBRID manufactured by Lasertec Corporation, with 20× objective lens) and subsequently using data analysis software (LMeye7). With height as a binarization parameter, Kittler's method can be used as an automatic threshold algorithm.

The conductive bumps 14 are preferably made of a resin composition and a conductive filler.

In other words, the conductive bumps 14 may be made of a conductive paste.

Using a conductive paste enables the conductive bumps 14 to be readily formed at any position and in any shape.

In addition, the conductive bumps 14 may be formed by screen printing.

When forming the conductive bumps 14 by screen printing using a conductive paste, the conductive bumps 14 can be readily and efficiently formed at any position and in any shape.

When the conductive bumps 14 are made up of a resin composition and a conductive filler, while the resin composition is not limited, examples of a resin composition that can be used include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition and thermoset resin compositions such as phenolic resin composition, epoxy resin composition, urethane resin composition, melamine resin composition, and an alkyd resin composition.

A material of the resin composition may be one independent material or a combination of two or more materials among the materials described above.

When the conductive bumps 14 are made up of a resin composition and a conductive filler, while the conductive filler is not limited, the conductive filler may be metal microparticles, a carbon nanotube, carbon fibers, metallic fibers, or the like.

When the conductive filler is metal microparticles, the metal microparticles may be, although not limited to, silver powder, copper powder, nickel powder, solder powder, aluminum powder, silver-coated copper powder created by subjecting copper powder to silver plating, or fine particles created by coating polymeric microparticles, glass beads, and the like with a metal.

Among these materials, inexpensively available copper powder or silver-coated copper powder is preferable from the perspective of economic efficiency.

While an average particle diameter $D_{50}$ of the conductive filler is not limited, the average particle diameter $D_{50}$ preferably ranges from 0.5 to 15.0 µm.

While a shape of the conductive filler is not limited, the shape can be appropriately selected from a spherical shape, a flat shape, a scale-like shape, a dendrite shape, a rod shape, a fibrous shape, and the like.

When the conductive bumps 14 are made up of a resin composition and a conductive filler, a weight ratio of the conductive filler preferably ranges from 30 to 99% and more preferably ranges from 50 to 99%.

In addition, the conductive bumps 14 may be made of a metal formed by a plating method, a vapor deposition method, or the like.

In this case, the conductive bumps are preferably made of copper, silver, tin, gold, palladium, aluminum, chromium, titanium, zinc, and an alloy including any one or more of these metals.

Conventional methods can be used as the plating method or the vapor deposition method.

(Adhesive Layer)

As described above, the electromagnetic wave shielding film 10 is to be pasted to the printed wiring board 20 by the adhesive layer 13.

In the electromagnetic wave shielding film 10, a surface on an opposite side of a surface that comes into contact with the shield layer 12 of the adhesive layer 13 is preferably flat.

When the surface is flat, the plurality of conductive bumps 14 are to uniformly penetrate the adhesive layer 13.

Therefore, the plurality of conductive bumps 14 are to uniformly come into contact with the plurality of ground circuits 22a.

In the electromagnetic wave shielding film 10, a thickness of the adhesive layer 13 preferably ranges from 5 to 30 µm and more preferably ranges from 8 to 20 µm.

When the thickness of the adhesive layer is less than 5 µm, since an amount of resin that constitutes the adhesive layer is small, sufficient adhesive performance is less likely to be obtained. In addition, the adhesive layer becomes more susceptible to damage.

When the thickness of the adhesive layer exceeds 30 µm, the adhesive layer becomes thick as a whole and flexibility may decline. In addition, the conductive bumps become less capable of penetrating the adhesive layer.

In the electromagnetic wave shielding film 10, relative permittivity of the resin constituting the adhesive layer 13 at a frequency of 1 GHZ and a temperature of 23° C. preferably ranges from 1 to 5 and more preferably ranges from 2 to 4.

In addition, a dielectric dissipation factor of the resin constituting the adhesive layer 13 at a frequency of 1 GHz and a temperature of 23° C. preferably ranges from 0.0001 to 0.03 and more preferably ranges from 0.001 to 0.002.

When the resin is within these ranges, transmission characteristics of the shielded printed wiring board 1 to be manufactured using the electromagnetic wave shielding film 10 can be improved.

While the adhesive layer 13 in the electromagnetic wave shielding film 10 may be a conductive adhesive layer or an insulating adhesive layer, from the perspective of lowering relative permittivity and a dielectric dissipation factor, the adhesive layer 13 is preferably an insulating adhesive layer.

As described above, the electromagnetic wave shielding film 10 is to be pasted to the printed wiring board 20 by the adhesive layer 13.

When the adhesive layer 13 is an insulating adhesive layer, since the adhesive layer 13 does not contain conductive substances such as a conductive filler, relative permittivity and a dielectric dissipation factor can be made sufficiently small. In this case, with the shielded printed wiring board 1 manufactured using the electromagnetic wave shielding film 10, favorable transmission characteristics are attained.

When the adhesive layer 13 has conductivity, the adhesive layer 13 is to contain conductive substances such as a conductive filler. When the adhesive layer 13 contains such conductive substances at a large content, relative permittivity and a dielectric dissipation factor of the entire adhesive layer 13 are likely to increase.

On the other hand, in order to obtain favorable transmission characteristics of the manufactured shielded printed wiring board 1, the entire adhesive layer 13 preferably has lower relative permittivity and a lower dielectric dissipation factor.

Therefore, even when the adhesive layer 13 contains conductive substances, the smaller a content of the conductive substances, the better to lower the relative permittivity and the dielectric dissipation factor of the entire adhesive layer 13.

The adhesive layer 13 may be made of a thermoset resin composition or a thermoplastic resin composition.

Examples of the thermoset resin composition include a phenolic resin composition, an epoxy resin composition, a urethane resin composition, a melamine resin composition, a polyamide resin composition, and an alkyd resin composition.

In addition, examples of the thermoplastic resin composition include a styrene resin composition, a vinyl acetate resin composition, a polyester resin composition, a polyethylene resin composition, a polypropylene resin composition, an imide resin composition, and an acrylic resin composition.

Furthermore, as an epoxy resin composition, an amide-modified epoxy resin composition is more preferable.

These resin compositions are suitable as a resin that constitutes the adhesive layer.

A material of the adhesive layer may be one independent material or a combination of two or more materials among the materials described above.

Next, a preferable aspect of each component of the printed wiring board 20 will be described.

(Base Film and Coverlay)

While materials of the base film 21 and the coverlay 23 are not limited, the base film 21 and the coverlay 23 are favorably made of engineering plastic. Examples of the engineering plastic include resins such as polyethylene terephthalate, polypropylene, cross-linked polyethylene, polyester, polybenzimidazole, polyimide, polyimide amide, polyetherimide, and polyphenylene sulfide.

In addition, among these engineering plastics, a polyphenylene sulfide film is preferable when flame retardancy is required and a polyimide film is preferable when heat resistance is required. A thickness of the base film 21 preferably ranges from 10 to 40 µm and a thickness of the coverlay 23 preferably ranges from 10 to 30 µm.

While a size of the opening portion 23a is not limited, the size of the opening portion 23a is preferably 0.1 mm² or more and more preferably 0.3 mm² or more.

In addition, a shape of the opening portion 23a is not limited and may be a circular shape, an elliptical shape, a square shape, a triangular shape, or the like.

(Printed Circuit)

The materials of the printed circuit 22 and the ground circuits 22a are not limited and may be a copper foil, a hardened material of a conductive paste, or the like.

As described above, in the electromagnetic wave shielding film 10, the conductive bumps 14 are arranged on a tessellation of quadrilaterals 50 so as to be positioned at vertices of the respective quadrilaterals 50.

In addition, in the electromagnetic wave shielding film 10, the conductive bumps 14 are not arrayed at regular intervals on a straight line that passes through line segments connecting nearest conductive bumps.

However, in the electromagnetic wave shielding film according to the present invention, the conductive bumps may be arranged on a straight line that passes through line segments connecting nearest conductive bumps as long as the conductive bumps are not arrayed at regular intervals.

Such an array of the conductive bumps will be described below with reference to the drawings.

Figure 5A:
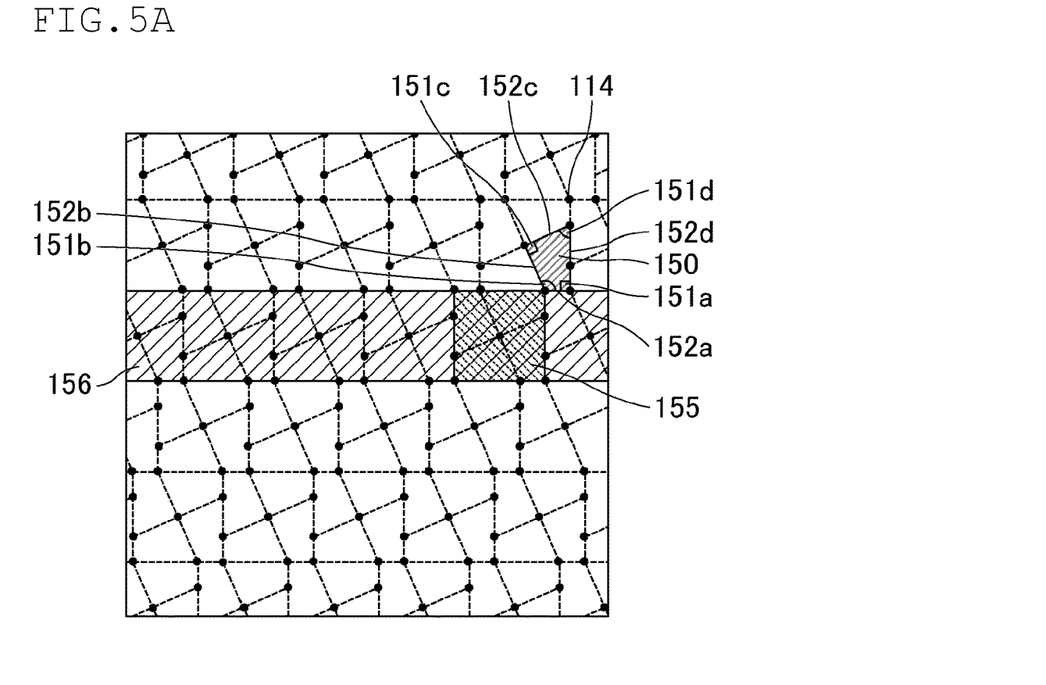
FIG. 5A is a plan view schematically showing an example of an array in a case where, in a plan view of the shield layer of the electromagnetic wave shielding film according to the present invention from a side of the adhesive layer, conductive bumps are arranged on a straight line that passes through a line segment connecting nearest conductive bumps.

FIG. 5A is a plan view schematically showing an example of an array in a case where, in a plan view of the shield layer of the electromagnetic wave shielding film according to the present invention from a side of the adhesive layer, conductive bumps are arranged on a straight line that passes through a line segment connecting nearest conductive bumps.

As shown in FIG. 5A, the conductive bumps 114 are arranged on a tessellation of quadrilaterals 150 so as to be positioned at vertices of the respective quadrilaterals 150.

While a quadrilateral denoted by a reference sign 150 is highlighted and illustrated in FIG. 5A for convenience of description, the highlighted and illustrated quadrilateral 150 is no different from other quadrilaterals in terms of structure, functions, and the like.

The quadrilateral 150 is a convex quadrilateral having a first corner 151a, a second corner 151b, a third corner 151c, and a fourth corner 151d.

In addition, the first corner 151a and the second corner 151b are connected by a first side 152a, the second corner 151b and the third corner 151c are connected by a second side 152b, the third corner 151c and the fourth corner 151d are connected by a third side 152c, and the fourth corner 151d and the first corner 151a are connected by a fourth side 152d.

The first corner 151a and the third corner 151c are right angles, the second corner 151b is an obtuse angle, and the fourth corner 151d is an acute angle. A sum of an angle of the second corner 151b and an angle of the fourth corner 151d is 180 degrees.

Lengths of the second side 152b and the third side 152c are the same but lengths of the first side 152a and the fourth side 152d differ from one another. In addition, lengths of the first side 152a and the second side 152c differ from one another and lengths of the second side 152b the fourth side 152d differ from one another.

Next, a mode of tessellation by the quadrilaterals 150 will be described.

First, four quadrilaterals 150 are combined to form a square (a graphic denoted by a reference sign 155 in FIG. 5A).

Squares 155 combined in this manner are arranged in a row to create a rectangle 156.

Next, rectangles 156 are successively lined up in a direction of a short side of the rectangles 156. In doing so, the rectangles 156 are arranged so that adjacent rectangles 156 are staggered by a length of the first side 152a in a long-side direction of the rectangles 156.

Accordingly, tessellation by the quadrilaterals 150 as shown in FIG. 5A can be achieved.

Next, a reason why the electromagnetic wave shielding film having the conductive bumps in the array shown in FIG. 5A is included in the electromagnetic wave shielding film according to the present invention will be described.

Figure 5B:
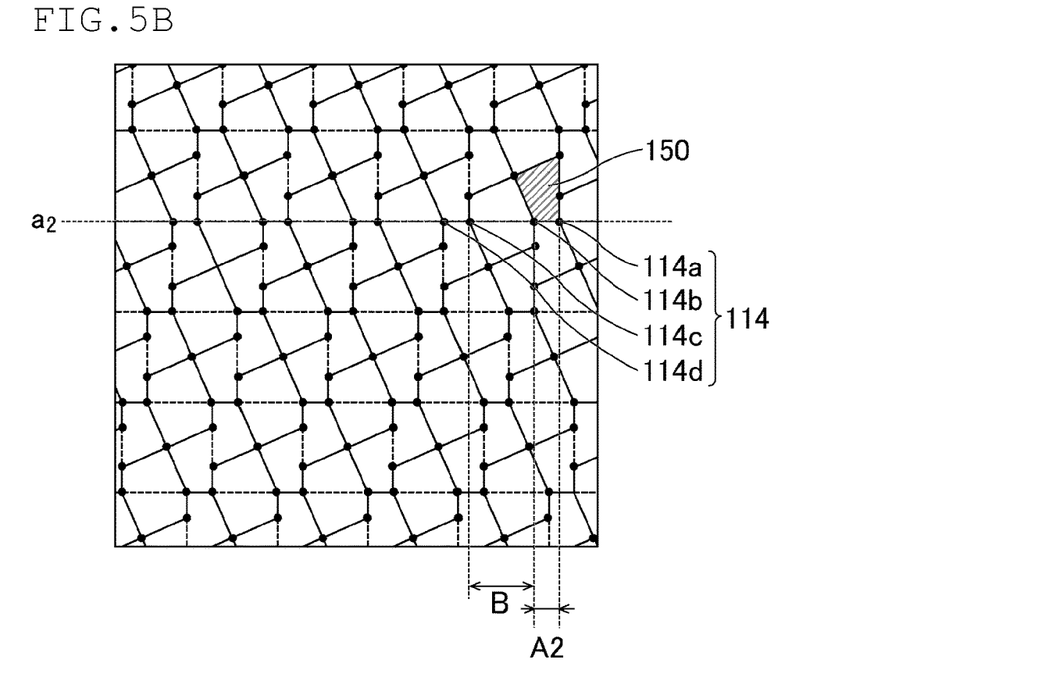
FIG. 5B is a plan view describing that the electromagnetic wave shielding film having conductive bumps in the array shown in FIG. 5A has the features of the electromagnetic wave shielding film according to the present invention.

FIG. 5B is a plan view describing that the electromagnetic wave shielding film having conductive bumps in the array shown in FIG. 5A has the features of the electromagnetic wave shielding film according to the present invention.

As shown in FIG. 5B, first, a line segment connecting each conductive bump 114 and a nearest conductive bump 114 at a nearest position (a line segment indicated by a solid line connecting conductive bumps 114 in FIG. 5B) is drawn.

In FIG. 5B, let us focus on a conductive bump 114a and a conductive bump 114b among the conductive bumps 114. The conductive bump 114a is a nearest conductive bump at a nearest position to the conductive bump 114b.

The conductive bump 114a and the conductive bump 114b are connected by a line segment A2.

When a straight line $a_2$ that passes through the line segment A1 is drawn, a conductive bump 114c that is adjacent to the conductive bump 114b is arranged on the straight line $a_2$.

However, the nearest conductive bump to the conductive bump 114c is a conductive bump 114d.

Therefore, a line segment B that connects the conductive bump 114b and the conductive bump 114c to each other is not a line segment that connects nearest conductive bumps.

In other words, the straight line $a_2$ has a portion that does not overlap with line segments that connect respective conductive bumps and nearest conductive bumps at a nearest position to each other.

The conductive bumps 114 being arrayed in this manner means that, in a plan view of the shield layer from the side of the adhesive layer, adjacent conductive bumps 114 are not linearly arrayed at regular intervals.

From the above, the electromagnetic wave shielding film having the conductive bumps 114 in the array shown in FIG. 5A can be described as being included in the electromagnetic wave shielding film according to the present invention.

By arranging, on a printed wiring board, the electromagnetic wave shielding film having the conductive bumps 114 in the array shown in FIG. 5A, parasitic circuits can be prevented from being created due to the conductive bumps being positioned on a signal circuit of the printed wiring board and, consequently, transmission loss can be reduced.

Next, other arrangements of conductive bumps in the electromagnetic wave shielding film according to the present invention will be described.

FIGS. 6A to 6D are plan views schematically showing an example of an array of conductive bumps in a plan view of the shield layer of the electromagnetic wave shielding film according to the present invention from a side of the adhesive layer.

While a single polygon and a combination of the polygons are highlighted and illustrated in FIGS. 6A to 6E for convenience of description, in the electromagnetic wave shielding film according to the present invention, the highlighted and illustrated polygon and combination of polygons are no different from other polygons in terms of structure, functions, and the like.

Figure 6A:
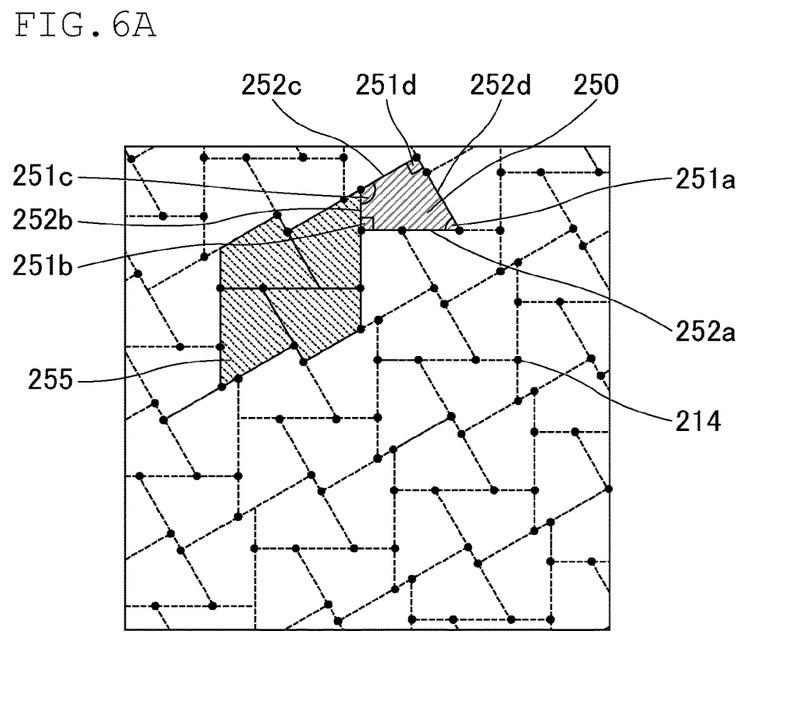
FIG. 6A is a plan view schematically showing an example of an array of conductive bumps in a plan view of the shield layer of the electromagnetic wave shielding film according to the present invention from a side of the adhesive layer.

As shown in FIG. 6A, the polygon may be a quadrilateral 250.

The quadrilateral 250 is a convex quadrilateral having a first corner 251a, a second corner 251b, a third corner 251c, and a fourth corner 251d.

The first corner 251a and the second corner 251b are connected by a first side 252a, the second corner 251b and the third corner 251c are connected by a second side 252b, the third corner 251c and the fourth corner 251d are connected by a third side 252c, and the fourth corner 251d and the first corner 251a are connected by a fourth side 252d.

The second corner 251b and the fourth corner 251d are right angles, the first corner 251a is an acute angle, and the third corner 251c is an obtuse angle. A sum of an angle of the first corner 251a and an angle of the third corner 251c is 180 degrees.

Lengths of the first side 252a, the second side 252b, the third side 252c, and the fourth side 252d differ from one another.

Next, a mode of tessellation by the quadrilaterals 250 will be described.

Four quadrilaterals 250 are combined to form an octagon denoted by a reference sign 255 in FIG. 6A.

By successively lining up the octagons 255, tessellation by the quadrilaterals 250 as shown in FIG. 6A can be achieved.

In addition, conductive bumps 214 are arranged so as to be positioned on vertices of the quadrilaterals 250.

Figure 6B:
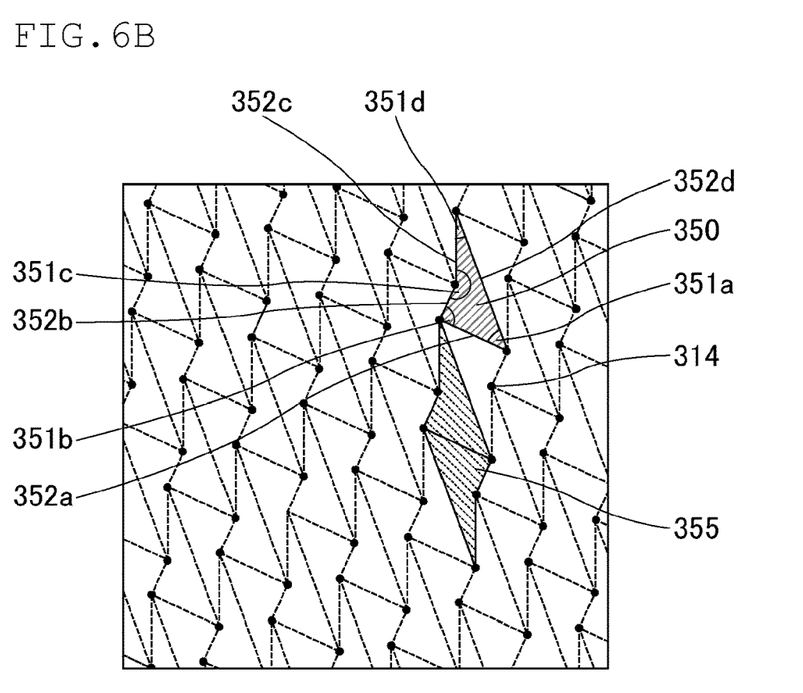
FIG. 6B is a plan view schematically showing an example of an array of conductive bumps in a plan view of the shield layer of the electromagnetic wave shielding film according to the present invention from a side of the adhesive layer.

As shown in FIG. 6B, the polygon may be a quadrilateral 350.

The quadrilateral 350 is a non-convex quadrilateral having a first corner 351a, a second corner 351b, a third corner 351c, and a fourth corner 351d.

In addition, the first corner 351a and the second corner 351b are connected by a first side 352a, the second corner 351b and the third corner 351c are connected by a second side 352b, the third corner 351c and the fourth corner 351d are connected by a third side 352c, and the fourth corner 351d and the first corner 351a are connected by a fourth side 352d.

An angle of the third corner 351c is larger than 180 degrees, and angles of the first corner 351a, the second corner 351b, the third corner 351c, and the fourth corner 351d differ from one another.

In addition, lengths of the first side 352a, the second side 352b, the third side 352c, and the fourth side 352d differ from one another.

Next, a mode of tessellation by the quadrilaterals 350 will be described.

Two quadrilaterals 350 are combined to form a hexagonal parallelogon (a graphic denoted by a reference sign 355 in FIG. 6B).

Since any congruent hexagonal parallelogon can tessellate a plane, by successively arranging the hexagonal parallelogons 355 combined in this manner, tessellation by the quadrilateral 350 as shown in FIG. 6B can be achieved.

In addition, conductive bumps 314 are arranged so as to be positioned on vertices of the respective quadrilaterals 350.

Figure 6C:
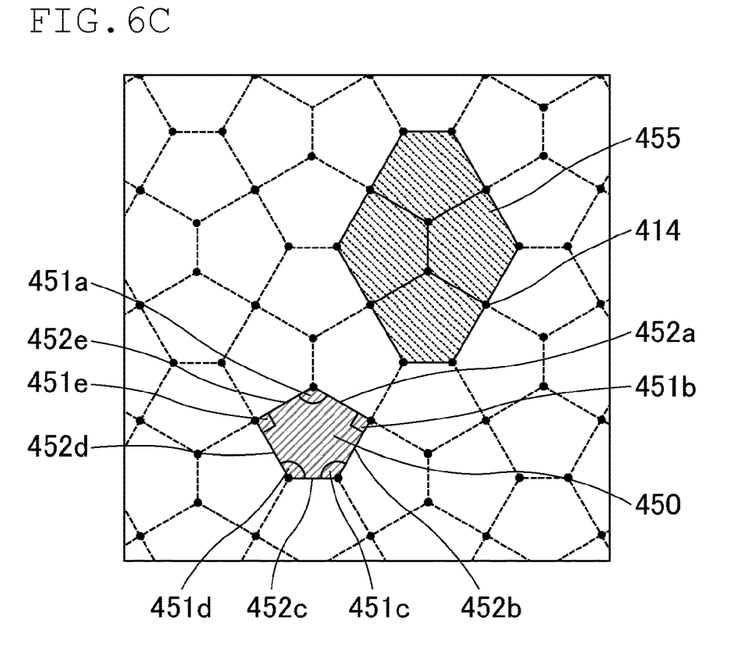
FIG. 6C is a plan view schematically showing an example of an array of conductive bumps in a plan view of the shield layer of the electromagnetic wave shielding film according to the present invention from a side of the adhesive layer.

As shown in FIG. 6C, the polygon may be a pentagon 450.

The pentagon 450 has a first corner 451a, a second corner 451b, a third corner 451c, a fourth corner 451d, and a fifth corner 451e. The first corner 451a and the second corner 451b are connected by a first side 452a, the second corner 451b and the third corner 451c are connected by a second side 452b, the third corner 451c and the fourth corner 451d are connected by a third side 452c, the fourth corner 451d and the fifth corner 451e are connected by a fourth side 452d, and the fifth corner 451e and the first corner 451a are connected by a fifth side 452e.

The second corner 451b and the fifth corner 451e are right angles.

A sum of angles of the first corner 451a, the third corner 451c, and the fourth corner 451d is 360 degrees and angles of the third corner 451c and the fourth corner 451d are the same.

In addition, lengths of the first side 452a, the second side 452b, the fourth side 452d, and the fifth side 452e are the same.

Note that lengths of the first side 452a and the third side 452c may be the same or may differ from each other.

Next, a mode of tessellation by the pentagons 450 will be described.

Four pentagons 450 are combined to form a hexagonal parallelogon (a graphic denoted by a reference sign 455 in FIG. 6C).

Since any congruent hexagonal parallelogon can tessellate a plane, by successively arranging the hexagonal parallelogons 455 combined in this manner, tessellation by the pentagons 450 as shown in FIG. 6C can be achieved.

In addition, conductive bumps 414 are arranged so as to be positioned on vertices of the respective pentagons 450.

Figure 6D:
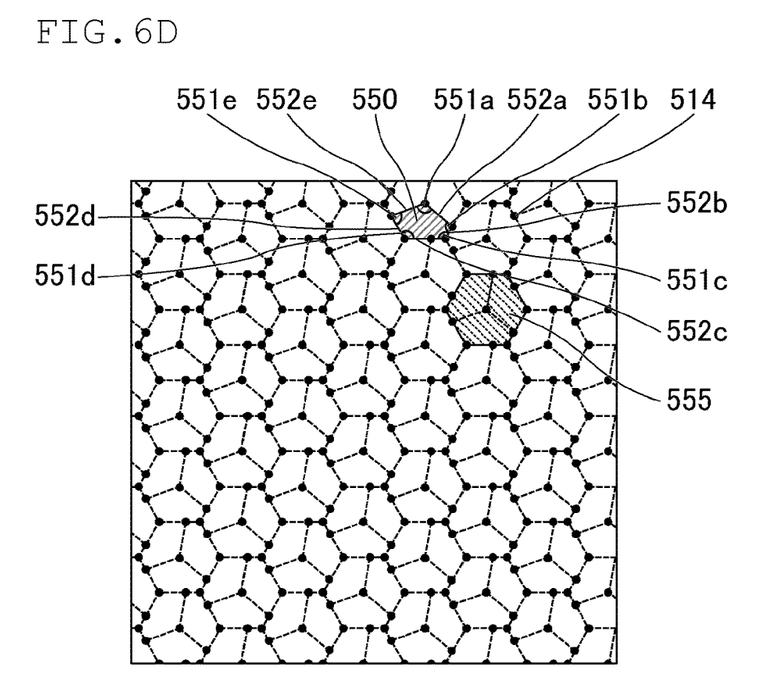
FIG. 6D is a plan view schematically showing an example of an array of conductive bumps in a plan view of the shield layer of the electromagnetic wave shielding film according to the present invention from a side of the adhesive layer.

As shown in FIG. 6D, the polygon may be a pentagon 550.

The pentagon 550 has a first corner 551a, a second corner 551b, a third corner 551c, a fourth corner 551d, and a fifth corner 551e. The first corner 551a and the second corner 551b are connected by a first side 552a, the second corner 551b and the third corner 551c are connected by a second side 552b, the third corner 551c and the fourth corner 551d are connected by a third side 552c, the fourth corner 551d and the fifth corner 551e are connected by a fourth side 552d, and the fifth corner 551e and the first corner 551a are connected by a fifth side 552e.

Angles of the first corner 551a, the third corner 551c, and the fourth corner 551d are 120 degrees.

In addition, angles of the second corner 551b and the fifth corner 551e differ from one another.

Lengths of the first side 552a and the fifth side 552e are the same.

A sum of the lengths of the second side 552b and the fourth side 552d is the same as the length of the third side 552c.

Next, a mode of tessellation by the pentagons 550 will be described.

Three pentagons 550 are combined to form a regular hexagon (a graphic denoted by a reference sign 555 in FIG. 6D).

Since a congruent regular hexagon can tessellate a plane, by successively arranging the regular hexagons 555 combined in this manner, tessellation by the pentagons 550 as shown in FIG. 6D can be achieved.

In addition, conductive bumps 514 are arranged so as to be positioned on vertices of the respective pentagons 550.

Figure 6E:
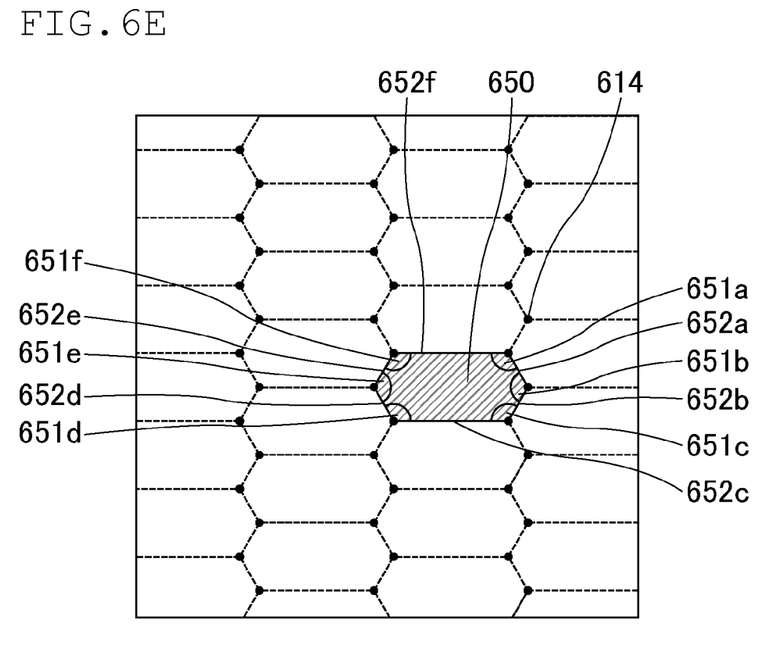
FIG. 6E is a plan view schematically showing an example of an array of conductive bumps in a plan view of the shield layer of the electromagnetic wave shielding film according to the present invention from a side of the adhesive layer.

As shown in FIG. 6E, the polygon may be a hexagonal parallelogon 650.

The hexagonal parallelogon 650 has a first corner 651a, a second corner 651b, a third corner 651c, a fourth corner 651d, a fifth corner 651e, and a sixth corner 651f. The first corner 651a and the second corner 651b are connected by a first side 652a, the second corner 651b and the third corner 651c are connected by a second side 652b, the third corner 651c and the fourth corner 651d are connected by a third side 652c, the fourth corner 651d and the fifth corner 651e are connected by a fourth side 652d, the fifth corner 651e and the sixth corner 651f are connected by a fifth side 652e, and the sixth corner 651f and the first corner 651a are connected by a sixth side 652f.

Angles of the first corner 651a, the second corner 651b, the third corner 651c, the fourth corner 651d, the fifth corner 651e, and the sixth corner 651f are 120 degrees.

Lengths of the first side 652a, the second side 652b, the fourth side 652d, and the fifth side 652e are the same. In addition, lengths of the third side 652c and the sixth side 652f are the same. Furthermore, the length of the first side 652a is shorter than the length of the third side 652c.

Since any congruent hexagonal parallelogon can tessellate a plane, by successively arranging the hexagonal parallelogons 650, tessellation by the hexagonal parallelogons 650 as shown in FIG. 6E can be achieved.

In addition, conductive bumps 614 are arranged so as to be positioned on vertices of the respective hexagonal parallelogons 650.

By arranging, on a printed wiring board, the electromagnetic wave shielding film in which the conductive bumps 214, the conductive bumps 314, the conductive bumps 414, the conductive bumps 514, or the conductive bumps 614 are arranged as described above, parasitic circuits can be prevented from being created due to the conductive bumps being positioned on a signal circuit of the printed wiring board and, consequently, transmission loss can be reduced.

While the conductive bumps heretofore described are arrayed as shown in FIG. 1B, FIG. 5A, and FIGS. 6A to 6E, in the electromagnetic wave shielding film according to the present invention, arrangements of the conductive bumps are not limited to the arrays described above as long as the conductive bumps are arranged so as to be positioned on a tessellation of one kind of polygon at vertices of respective polygons and, with respect to each of the conductive bumps, when drawing line segments connecting the respective conductive bumps and nearest conductive bumps at a nearest position and drawing a straight line passing through one line segment among the drawn line segments, the conductive bumps are arranged so that the straight line has a portion that does not overlap with other line segments.

For example, an electromagnetic wave shielding film in which conductive bumps are arranged on a tessellation of a graphic such as an isosceles trapezoid or a kite shape so as to be positioned on vertices of the respective polygons but, at the same time, conductive bumps are not arranged at regular intervals on a straight line that passes through line segments connecting nearest conductive bumps is included in the electromagnetic wave shielding film according to the present invention.

On the other hand, when conductive bumps are arranged on vertices of a tetragonal lattice, a rectangular lattice, a rhombic lattice, or a parallelogrammatic lattice, conductive bumps end up being arranged at regular intervals on a straight line that passes through line segments connecting nearest conductive bumps. Therefore, an electromagnetic wave shielding film including conductive bumps arranged in such a manner is not included in the electromagnetic wave shielding film according to the present invention.

In addition, the polygons to be tessellated may be convex polygons or non-convex polygons.

REFERENCE SIGNS LIST 1 shielded printed wiring board
10 electromagnetic wave shielding film
11 protective layer
12 shield layer
13 adhesive layer
14, 14a, 14b, 114, 114a, 114b, 114c, 114d, 214, 314, 414, 514, 614 conductive bump
20 printed wiring board
21 base film
22 printed circuit
22a ground circuit
23 coverlay
23a opening portion

The invention claimed is:

1. An electromagnetic wave shielding film, comprising:
a protective layer;
a shield layer laminated on the protective layer; and
an adhesive layer laminated on the shield layer,
a plurality of conductive bumps being formed on a side of the adhesive layer of the shield layer,
wherein in a plan view of the shield layer from the side of the adhesive layer, the conductive bumps are arranged so as to define a tessellation of identical polygons, with conductive bumps positioned at vertices of respective polygons within the tessellation, and
wherein the plurality of conductive bumps are arranged such that there is no line within the tessellation 1) along which sides of a plurality of the polygons are aligned and 2) along which pairs of conductive bumps that are closest together in a given direction are all spaced apart by the same distance.

2. The electromagnetic wave shielding film according to claim 1, wherein the polygons within the tessellation are convex.

3. The electromagnetic wave shielding film according to claim 1, wherein the polygons within the tessellation are non-convex.

* * * * *